United States Patent
Stultz et al.

(10) Patent No.: US 8,934,642 B2
(45) Date of Patent: *Jan. 13, 2015

(54) NO POP SWITCH

(71) Applicant: Fairchild Semiconductor Corporation, San Jose, CA (US)

(72) Inventors: Julie Lynn Stultz, Scarborough, ME (US); Steven Macaluso, Scarborough, ME (US); Enrique O. Rodriguez, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/103,013

(22) Filed: Dec. 11, 2013

(65) Prior Publication Data

US 2014/0098297 A1  Apr. 10, 2014

Related U.S. Application Data

(63) Continuation of application No. 12/878,779, filed on Sep. 9, 2010, now Pat. No. 8,625,818, which is a continuation-in-part of application No. 12/834,472, filed on Jul. 12, 2010.

(60) Provisional application No. 61/225,064, filed on Jul. 13, 2009.

(51) Int. Cl.
*H04B 15/00* (2006.01)
*H03K 17/16* (2006.01)
*H03K 17/00* (2006.01)
*H03K 17/30* (2006.01)

(52) U.S. Cl.
CPC ............. *H03K 17/16* (2013.01); *H03K 17/005* (2013.01); *H03K 17/30* (2013.01)
USPC ....................................................... 381/94.5

(58) Field of Classification Search
CPC .................................. H04B 15/00; H02B 1/00
USPC ........................................ 381/94.5, 123, 81
See application file for complete search history.

(56) References Cited

U.S. PATENT DOCUMENTS

| | | |
|---|---|---|
| 4,675,905 A | 6/1987 | Flora et al. |
| 4,788,508 A | 11/1988 | Kawai |

(Continued)

FOREIGN PATENT DOCUMENTS

| | | |
|---|---|---|
| CN | 101276588 A | 10/2008 |
| CN | 101409560 A | 4/2009 |

(Continued)

OTHER PUBLICATIONS

"U.S. Appl. No. 12/834,472, Response filed Jul. 26, 2013 to Non Final Office Action mailed Feb. 26, 2013", 11 pgs.

(Continued)

*Primary Examiner* — Disler Paul
(74) *Attorney, Agent, or Firm* — Schwegman Lundberg & Woessner, P.A.

(57) ABSTRACT

A switch can be configured to receive a first signal at a first input and provide an output signal at an output, depending on a state of the switch. A switch state change can be delayed until an indication of a requested switch state different than a current switch state is received and the first signal reaches a threshold.

20 Claims, 7 Drawing Sheets

(56) References Cited

U.S. PATENT DOCUMENTS

| | | | |
|---|---|---|---|
| 5,222,150 A * | 6/1993 | Tajima | 381/105 |
| 6,157,726 A | 12/2000 | Carroll et al. | |
| 6,993,127 B2 * | 1/2006 | Bailey | 379/392.01 |
| 7,092,533 B1 * | 8/2006 | Hasegawa et al. | 381/94.5 |
| 7,498,881 B2 | 3/2009 | Wang | |
| 7,827,030 B2 | 11/2010 | Smith et al. | |
| 8,098,840 B2 * | 1/2012 | Ku | 381/81 |
| 8,139,791 B1 * | 3/2012 | Toosky | 381/120 |
| 8,155,347 B2 * | 4/2012 | Li et al. | 381/94.5 |
| 8,160,277 B2 * | 4/2012 | Noethlings et al. | 381/119 |
| 8,199,930 B2 * | 6/2012 | Wu | 381/94.5 |
| 8,625,818 B2 | 1/2014 | Stultz et al. | |
| 2004/0151329 A1 | 8/2004 | Judge et al. | |
| 2006/0238247 A1 | 10/2006 | Kang | |
| 2008/0240464 A1 * | 10/2008 | Noethlings et al. | 381/94.5 |
| 2008/0312932 A1 | 12/2008 | Smith et al. | |
| 2009/0160412 A1 | 6/2009 | Latham et al. | |
| 2009/0208032 A1 | 8/2009 | Wu et al. | |
| 2011/0010750 A1 | 1/2011 | Rodriguez | |
| 2011/0163783 A1 | 7/2011 | Stultz et al. | |

FOREIGN PATENT DOCUMENTS

| | | |
|---|---|---|
| CN | 101419792 A | 4/2009 |
| CN | 102025355 A | 4/2011 |
| CN | 102437840 A | 5/2012 |
| DE | 102011112859 A1 | 3/2012 |
| JP | 0621791 A | 1/1994 |
| JP | 2011024208 A | 2/2011 |
| JP | 201260643 A | 3/2012 |
| KR | 20110006632 A | 1/2011 |
| KR | 1020120026467 A | 3/2012 |
| TW | 201126904 A | 8/2011 |
| TW | 201230682 A | 7/2012 |

OTHER PUBLICATIONS

"U.S. Appl. No. 12/878,779, Response filed Aug. 19, 2013 to Non Final Office Action mailed May 17, 2013", 12 pgs.

"U.S. Appl. No. 12/878,779, Non Final Office Action mailed May 17, 2013", 20 pgs.

"U.S. Appl. No. 12/878,779, Notice of Allowance mailed Sep. 4, 2013", 9 pgs.

"Chinese Application Serial No. 201010511652.3, Office Action mailed Sep. 2, 2013", 8 pgs.

"U.S. Appl. No. 12/834,472, Final Office Action mailed Apr. 25, 2014", 16 pgs.

"U.S. Appl. No. 12/834,472, Non Final Office Action mailed Feb. 26, 2013", 15 pgs.

"U.S. Appl. No. 12/834,472, Non Final Office Action mailed Aug. 28, 2013", 19 pgs.

"U.S. Appl. No. 12/834,472, Response filed Feb. 28, 2014 to Non Final Office Action mailed Aug. 28, 2013", 10 pgs.

"Chinese Application Serial No. 201010511652.3, Response filed Mar. 17, 2014 to Office Action mailed Sep. 2, 2013", 17 pgs.

"Chinese Application Serial No. 201110281331.3, Office Action mailed Nov. 22, 2013", w/English Translation, 13 pgs.

"Japanese Application Serial No. 2010-158207, Office Action mailed Feb. 25, 2014", 2 pgs.

\* cited by examiner

NO POP SWITCH

CLAIM OF PRIORITY

This application is a continuation of U.S. patent application Ser. No. 12/878,779, filed on Sep. 9, 2010, which is a continuation-in-part application of U.S. patent application Ser. No. 12/834,472 filed Jul. 12, 2010, which claims the benefit of priority under 35 U.S.C §119(e) of U.S. Provisional Patent Application Ser. No. 61/225,064 filed Jul. 13, 2009, the benefit of priority of each of which is claimed hereby, and each of which are incorporated by reference herein in its entirety.

BACKGROUND

Generally, switching between two or more signals at different potentials can result in a sudden change that can be harmful or undesirable. For example, switching between different audio or video signals at different potentials can result in an audio pop, a visual distortion, or one or more other undesirable effects. In other examples, switching between two signals at different potentials (e.g., first and second voltage signals having different values) can lead to a sudden current spike, or one or more other harmful or undesirable effects.

OVERVIEW

In certain examples, a switch can be configured to receive a first signal at a first input and provide an output signal at an output, the output depending on a state of the switch. The present inventors have recognized that switching signals at or near the same potential can reduce sudden output changes. In an example, a switch state change can be delayed until an indication of a requested switch state different than a current switch state is received and the first signal reaches a threshold, to eliminate or reduce harmful or undesirable effects, such as audio pop, electric shock, etc.

In a first example, Example 1, an apparatus includes a switch. The switch can include a first input configured to receive a first signal, a second input configured to receive a second signal, a control input configured to receive a control signal and in response to the control signal, to couple one of the first or the second input signals to an output to control a state of the switch, and the output configured to provide an output signal using the first signal, the second signal, and the control signal. The apparatus can further include a control circuit configured to receive the first signal, the second signal, and an indication of a requested switch state, to provide the control signal to the switch, and to delay a switch state change until the indication of the requested switch state is different than a current switch state and a comparison of information indicative of the first signal and information indicative of the second signal satisfies a threshold.

In Example 2, the control circuit of Example 1 optionally includes a first shift circuit configured to provide an offset version of the first signal within a specified voltage range above a specified reference voltage when the requested switch state is different than the current switch state, wherein the information indicative of the first signal includes the offset version of the first signal. The control circuit of Example 1 optionally includes a second shift circuit configured to provide an offset version of the second signal within a specified voltage range above a specified reference voltage when the requested switch state is different than the current switch state, and wherein the information indicative of the second signal includes the offset version of the second signal.

In Example 3, the first and second shift circuits of any one or more of Examples 1-2 are optionally configured to be enabled when the indication of the requested switch state is different than a current switch state, and are optionally configured to be disabled when the indication of the requested switch state is the same as the current switch state to conserve power consumption.

In Example 4, at least one of the first or second shift circuits of any one or more of Examples 1-3 optionally includes a current source, a resistive network coupled to the current source, and a transistor. The transistor of Example 4 optionally includes a source terminal coupled to the resistive network in series with the current source, a drain terminal coupled to ground, and a gate terminal configured to receive a signal. The offset version of the signal of Example 4 is optionally provided at a junction of the resistive network and the current source.

In Example 5, the control circuit of any one or more of Examples 1-4 optionally includes a comparator configured to compare the offset version of the first signal to the offset version of the second signal and to provide a comparator output indicative of the difference between the offset version of the first signal and the offset version of the second signal.

In Example 6, the control circuit of any one or more of Examples 1-5 optionally includes a first attenuator configured to attenuate the magnitude of the first signal and to provide the attenuated first signal to the first shift circuit, and a second attenuator to attenuate the magnitude of the second signal and to provide the attenuated first signal to the first shift circuit.

In Example 7, each of the first attenuator and the second attenuator of any one or more of Examples 1-6 optionally includes a voltage divider to attenuate the first signal and the second signal.

In Example 8, each of the first attenuator and the second attenuator of any one or more of Examples 1-7 optionally includes an enable circuit configured to receive an enable signal, to provide an attenuated version of a received signal when the enable signal is in a first state, and to reduce power consumption of the attenuator when the enable signal is in a second state.

In Example 9, each of the first attenuator and the second attenuator of any one or more of Examples 1-8 optionally includes respective isolated transistor coupled to the voltage divider, the isolated transistor configured to allow the attenuated signal to oscillate about ground using a single voltage source when the enable signal is in the first state, wherein a reference voltage of the isolated transistor is responsive to a negative swing of the received signal.

In Example 10, the enable circuit of any one or more of Examples 1-9 is optionally configured to disable the isolated NMOS transistor when the enable signal is in the second state.

In Example 11, the switch of any one or more of Examples 1-10 optionally includes an audio switch, the first signal of any one or more of Examples 1-10 optionally includes a first audio signal, the second signal of any one or more of Examples 1-10 optionally includes a second audio signal, and the output of the audio switch of any one or more of Examples 1-10 is optionally configured to be coupled to a speaker.

In Example 12, the switch of any one or more of Examples 1-11 optionally includes a video switch, the first signal any one or more of Examples 1-11 optionally includes a first video signal, the second signal any one or more of Examples 1-11 optionally includes a second video signal, and the output of the video switch any one or more of Examples 1-11 optionally is configured to be coupled to a display.

In Example 13, a method includes receiving a first signal at a first input of the switch, receiving a second signal at a second input of the switch, receiving a control signal at a control input of the switch, providing the first signal at an output of the switch when the control signal indicates a first state, generating switch transition information using the first signal and the second signal, and providing the second signal at the output of the switch when the control signal indicates a second state and when the switch transition information meets a threshold.

In Example 14, the providing switch information of any one or more of Examples 1-13 optionally includes comparing a version of the first signal to a version of the second signal.

In Example 15, the providing switch information of any one or more of Examples 1-14 optionally includes shifting the first signal above ground to provide a version of the first signal, and shifting the second signal above ground to provide a version of the second signal.

In Example 16, the shifting the first signal of any one or more of Examples 1-15 optionally includes attenuating the first signal to limit a range of the version of the first signal form about ground to about the voltage value of the single supply voltage, and the shifting the second signal of any one or more of Examples 1-15 optionally includes attenuating the second signal to limit a range of the version of the second signal from about ground to about the voltage value of the single supply voltage.

In Example 17, the receiving the control signal having the second state of any one or more of Examples 1-16 optionally includes enabling a first and second shift circuit to provide a shifted version of the first and second signal, and the providing the second signal at the output of the switch of any one or more of Examples 1-16 optionally includes disabling the first and second shift circuit to conserve power consumption of the switch.

In Example 18, the enabling a first and second shift circuit of any one or more of Examples 1-17 optionally includes enabling a current source of the first and second shift circuits.

In Example 19, the receiving the control signal having the second state of any one or more of Examples 1-18 optionally includes enabling a first and second attenuator circuit to provide the version of the first signal and the version of the second signal, and the providing the second signal at the output of the switch of any one or more of Examples 1-18 optionally includes disabling the first and second attenuator circuit to conserve power consumption of the switch.

In Example 20, the providing switch transition information of any one or more of Examples 1-19 optionally includes comparing a version of the first signal and a version of the second signal, and providing relative amplitude information of the first signal and the second signal using the comparison.

In Example 21, the providing switch transition information of any one or more of Examples 1-20 optionally includes comparing a version of the first signal and a version of the second signal, and providing relative phase information of the first signal and the second signal using the comparison.

In Example 22, an apparatus includes a single power supply input and a switch including a first input configured to receive a first signal having a magnitude, a second input configured to receive a second signal having a magnitude, a control input configured to receive a control signal to control a state of the switch, and an output configured to provide an output signal using the first signal, the second signal, and the control signal. The apparatus of example 22 also includes a control circuit configured to receive the first signal, the second signal, and an indication of a requested switch state, to provide the control signal to the switch, and to delay a switch state change until the indication of the requested switch state is different than a current switch state and a comparison using the first signal and the second signal satisfies a threshold, wherein the control circuit includes a first attenuator to receive the first signal and to provide an attenuated version of the first signal, a first shift circuit to receive the attenuated version of the first signal and to provide an attenuated and shifted version of the first signal, a second attenuator to receive the second signal and provide an attenuated version of the second signal, a second shift circuit to receive the attenuated version of the second signal and to provide an attenuated and shifted version of the second signal, and a comparator configured to provide switch transition information using the comparison the attenuated and shifted version of the first signal and the attenuated and shifted version of the second signal, and to compare the switch transition information to the threshold.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventor has recognized, among other things, that switching one or more inputs can be controlled to eliminate or reduce harmful or undesirable effects, such as audio pop, electric shock, etc.

In an example, a switch (e.g., an analog switch) can be used to switch an audio input (e.g., turn on, turn off, mute, etc.), or to switch between multiple audio inputs. In certain examples, a fast transition in an audio output can result in an audio pop or one or more other audio distortions (e.g., caused by a sudden increase in current through a speaker). The present inventor has recognized, among other things, that an audio switch can be configured to change between the first and second audio signals when the signals are similar (e.g., similar in amplitude, similar in phase, etc.) to eliminate or reduce the audio pop or other audio distortion. In other examples, the present inventor has recognized that, when switching an audio input on or off, the audio switch can be configured to change states (e.g., between open and closed) when a first audio input reaches a threshold, or is similar to an output of the switch (e.g., prior to closing the switch, after opening the switch, etc.) to eliminate or reduce the audio pop or other audio distortion.

In an example, the switch can be controlled by adjusted or controlling a timing of the switch (e.g., introducing delay) to minimize the difference between the input and the output of the switch, such as between first and second audio signals, etc.

Figure 1:
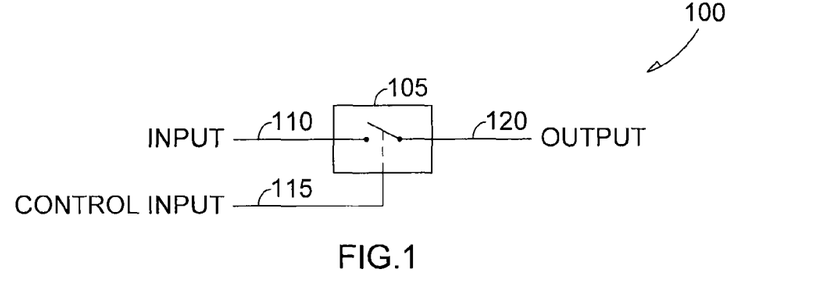
FIGS. 1 and 4 illustrate generally examples of a system that can include a switch configured to receive an input and to produce an output.

FIG. 1 illustrates generally an example of a system 100 including a switch 105 having a first input 110 configured to receive a first signal, a control input 115 configured to receive a control signal to control a state of the switch, and an output 120 configured to provide an output signal using the first signal and the control signal.

In an example, the first input 110 can configured to receive the first signal, such as an audio signal, a video signal, or one or more other signals. The output 120 can be coupled to a speaker, a video display, or one or more other output devices, and the switch 105 can be configured to turn on, turn off, mute, or otherwise enable, disable, or interrupt the first input 110 and the output 120.

In an example, the control input 115 can be configured to receive a control signal to control the switch 105 to eliminate or reduce audio pop or one or more other distortion associated with switching between an input signal and an output signal having different potentials. In certain examples, the difference in potential can be filtered to reduce the effect. However, doing so can require additional components or circuitry, and the resulting output signal can be changed from the original input. The present inventors have recognized that, if the first signal includes amplitude variation in time that overlaps or approaches a threshold (e.g., ground, a resting potential of an input of a device coupled to the output 120, or one or more other input signals), then the control input 115 can control the switch 105 to minimize potential adverse effects of the switching (e.g., audio pop, distortions, etc.).

In typical switching applications, the control signal controls a state of the switch 105 (e.g., open, closed, etc.) when a request to alter the state of the switch 105 is received (e.g., a power-on request, a power-off request, a mute request, a request to switch between multiple audio signals, etc.). In these examples, if the first input 110 and the output 120 are at different potentials, an audio pop or other distortion can result.

In certain examples, typical vocal frequencies can range from approximately 20 Hz to 20,000 Hz. The present inventor has recognized, among other things, that the control signal can be configured to delay a change of state of the switch 105 until the first input 110 and the output 120 (in certain examples, the potential future output, should the change of state of the switch 105 be to open) are approximately equal, or until the difference between the first input 110 and the output 120 can be minimized. In audio switching applications, even at low vocal frequencies, assuming that the first signal overlaps the output signal or one or more other thresholds, a maximum delay to the change of state of the switch 105 can be merely 0.0125 seconds (typically much less), representing one full period of the first signal at the first input 110 at low vocal frequencies. In other examples, if the first signal does not overlap the output signal or one or more other thresholds, the control signal can be configured to find a minimum difference between the first signal and the output signal or the one or more other thresholds in a first period, and then delay the change of state of the switch 105 until the minimum difference is reached in the second period. In certain examples, the control signal can be configured to provide a delay to account for a phase difference between the first input 110 and the output 120.

In other examples, the first input 110 can be configured to receive one or more signals other than audio or video signals, and the output 120 can be configured to provide the one or more signals to a device configured to receive the one or more signals. In these examples, the state of the switch 105 can be changed when the first input 110 is similar to the output 120 (or similar to an expected output), such as to minimize adverse effects associated with switching signals at different potentials (e.g., a sudden rise in current, etc.). In certain examples, when switching between multiple inputs, the state of the switch 105 can be changed when the first input 110 is similar to one or more other inputs.

Figure 2:
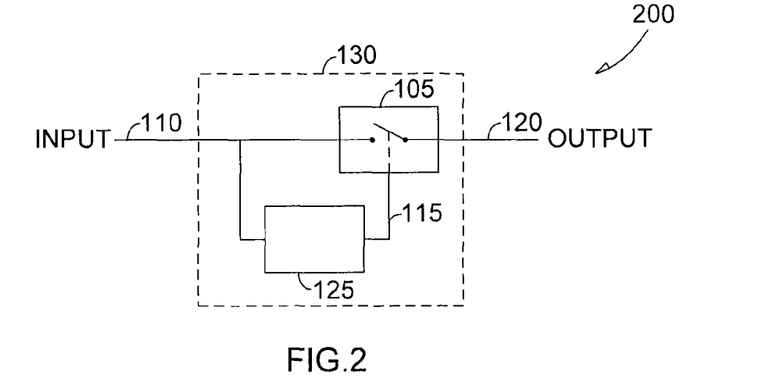
FIGS. 2-3 and 5-6 illustrate generally examples of a system that can include a switch module.

FIG. 2 illustrates generally an example of a system 200 including a switch module 130, the switch module 130 including a switch 105 and a controller 125. In certain examples, the controller 125 can include a digital controller (e.g., a processor, etc.), analog or digital circuitry, or one or more other controllers configured to receive a first signal from a first input 110 and to provide a control signal to a control input 115 of the switch 105. In an example, the controller 125 can be configured to delay a switch state change until an indication of a requested state change is different than a current switch state and until the first signal reaches or approaches a threshold.

In an example, the controller 125 can be configured to receive an indication of a requested switch state (e.g., from a user, from a processor, etc.). If the indication of the requested switch state is different than a current switch state and the first signal reaches a threshold, then the controller 125 can be configured to provide the control signal to the control input 115 to change the state of the switch 105.

In certain examples, the first signal at the first input 110 can be indicative of a requested switch state. For example, a user can select a signal (e.g., an audio signal, a video signal, etc.) to be provided to the output 120, and a processor can be configured to provide the signal to the switch 105. In other examples, such as without the switch 105, the first signal would be provided directly to the output 120. In this example, the presence of the first signal is indicative of a request from a user or processor to provide the first signal. In other examples, the controller 125 can receive a separate request from the user (e.g., a mute request, etc.). Once the request, or the signal indicative of the request, is received, the controller 125 can monitor the first signal at the first input 110 and control the switch to open or close at a specified amplitude, phase, etc.

In certain examples, the controller 125 can be configured to provide the control signal change the state of the switch 105 when the first signal at the first input 110 approaches or reaches a threshold. In an example, the threshold can include ground or one or more other levels, depending on the application. In an example, the threshold can include a value of an input of a device coupled to the output 120 of the switch 105, such as a speaker, a display, or one or more other devices configured to receive the output signal from the switch 105. In certain examples, the controller 125 can take into account the phase of the first signal at the first input 110, and can change the state of the switch 105 using the phase information.

Figure 3:
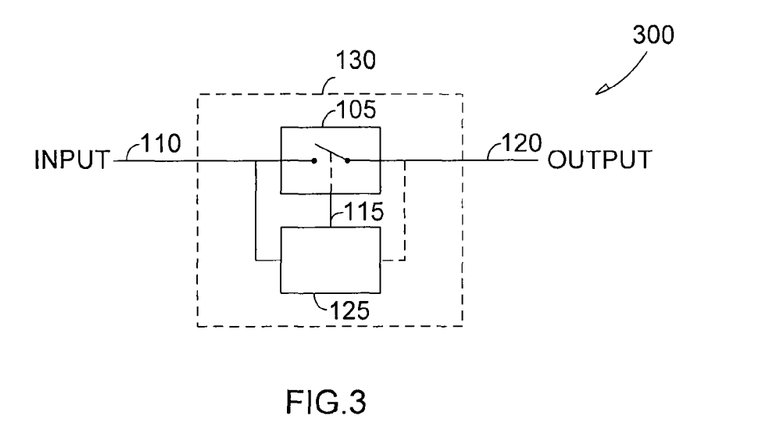

FIG. 3 illustrates generally an example of a system 300 including a switch module 130, the switch module 130 including a switch 105 and a controller 125. In this example, the controller 125 can be configured to receive a first signal from a first input 110 and an output signal from an output 120. In an example, the controller 125 can be configured to delay a switch state change until an indication of a requested switch state (e.g., open, closed, etc.) is different than a current switch state and the first signal from the first input 110 reaches or approaches the output signal from the output 120.

In other examples, if the first signal doesn't reach the output signal, then the switch state change can be delayed until the difference between the first signal and the output signal is minimized. In other examples, the switch state change can be delayed until the difference between the first signal and one or more other thresholds or other signals can be minimized (e.g., to eliminate or reduce harmful or undesirable effects).

Figure 4:
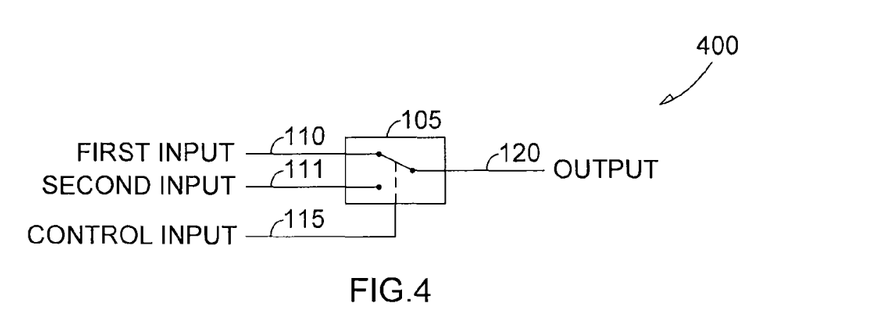

FIG. 4 illustrates generally an example of a system 400 including a switch 105 having a first input 110 configured to receive a first signal, a second input 111 configured to receive a second signal, the second signal different than the first signal, a control input 115 configured to receive a control signal to control a state of the switch, and an output 120 configured to provide an output signal using the control signal and at least one of the first signal or the second signal.

In an example, the control input 115 can be configured to receive a control signal to control the switch 105 to eliminate or reduce audio pop or one or more other distortion associated with switching between the first and second signals having different potentials, or with switching between the first or second signals and the output signal having different potentials.

In typical switching applications between multiple input signals, the control signal controls a state of the switch 105 (e.g., open, closed, etc.) when a request to alter the state of the switch 105 is received (e.g., a power-on request, a power-off request, a mute request, a request to switch between multiple audio signals, etc.). In these examples, if the first input 110 and the second input 111 are at different potentials, or if the first input 110 or the second input 111 are at different potentials with respect to the output 120, an audio pop or other distortion can result.

In certain examples, switching between first and second input signals can be similar to switching between a first signal and an output, or between a first signal and a threshold. In this example, the switch state includes a first position configured to couple the first input 110 to the output 120 and a second position configured to couple the second input 111 to the output 120. In other examples, one or more other switch configurations can be used having one or more other inputs or input configurations. For example, the switch 105 can include a first input 110 and a second input 111, each having separate switches having an open state and a closed state, configured to couple or de-couple each of the first input 110 and the second input 111 to the output 120.

In the example of FIG. 4, the switch 105 is in the first position, and the first input 110 is coupled to the output 120. In an example, when an indication of a requested switch state is received, the control signal can be configured to delay the switch state change until the indication of the requested switch state is different than a current switch state (e.g., until the indication of the requested switch state includes the second position), and until the second signal at the second input 111 reaches a threshold. In an example, the threshold can include a value (e.g., amplitude) of the first signal, such that the difference between the first and second signals is minimized when the state of the switch is changed. In other examples, the threshold can include a value of the output signal.

Figure 5:
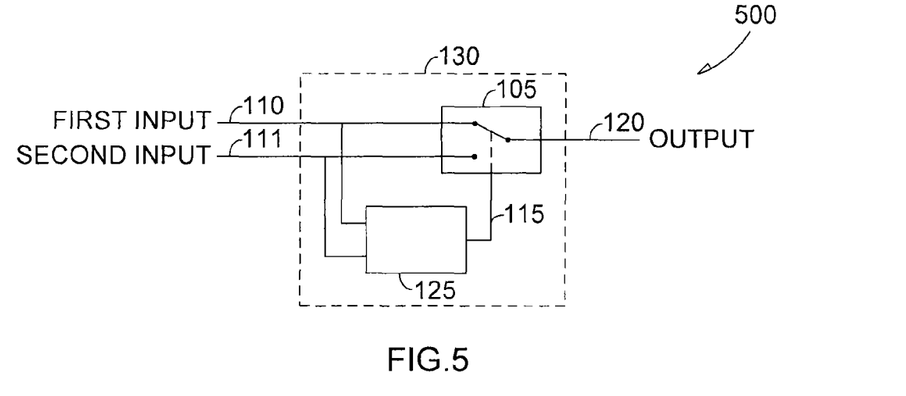

FIG. 5 illustrates generally an example of a system 500 including a switch module 130, the switch module 130 including a switch 105 and a controller 125. In an example, the controller 125 can be configured to receive a first signal from the first input 110 and a second signal from the second input 11. In an example, the controller 125 can be configured to delay a switch state change until an indication of a requested state change is different than a current switch state and until the first signal or the second signal reaches or approaches a threshold. In an example, the controller 125 can be configured to delay a switch state change until the first signal reaches or approaches the second signal. In other examples, one or more other thresholds can be used.

In an example, if the switch 105 is in a first position (coupling the first input 110 to the output 120) and an indication of a requested switch state to a second position (coupling the second input 111 to the output 120) is received, then the controller 125 can be configured to delay the switch state change from the first position to the second position until the second signal (e.g., the amplitude of the second signal) at the second input 111 reaches or approaches the first signal (e.g., the amplitude of the first signal) at the first input 110.

Figure 6:
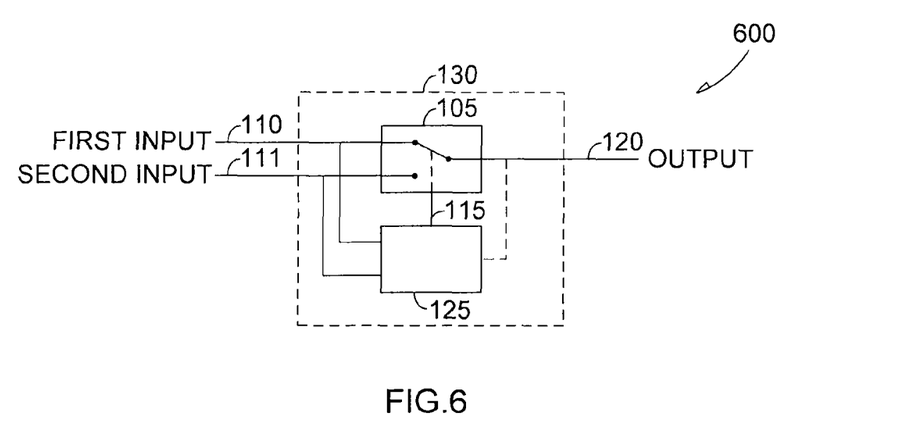

FIG. 6 illustrates generally an example of a system 600 including a switch module 130, the switch module 130 including a switch 105 and a controller 125. In this example, the controller 125 can be configured to receive a first signal from a first input 110, a second signal from a second input 111, and an output signal from an output 120. In an example, the controller 125 can be configured to delay a switch state change until an indication of a requested switch state is different than a current switch state and until the first signal from the first input 110 or the second signal from the second input 111 reaches or approaches the output signal from the output 120.

In an example, if the switch 105 is in a first position (coupling the first input 110 to the output 120) and an indication of a requested switch state to a second position (coupling the second input 111 to the output 120) is received, then the controller 125 can be configured to delay the switch state change from the first position to the second position until the second signal (e.g., the amplitude of the second signal) at the second input 111 reaches or approaches the output signal (e.g., the amplitude of the output signal) at the output 120.

Figure 7:
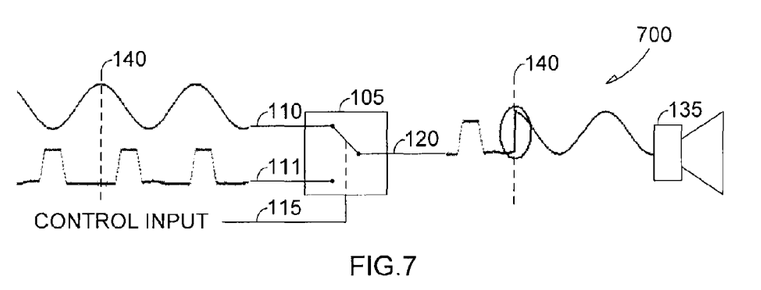
FIG. 7 illustrates generally an example of a switching system including an audio switch configured to receive first and second audio signals and to produce an output including an audio pop.

FIG. 7 illustrates generally an example of an audio switching system 700 including an audio switch 105 having a first input 110 configured to receive a first audio signal, a second input 111 configured to receive a second audio signal, a control input 115 configured to receive a control signal, and an output 120 configured to provide an output signal to a speaker 135, the output signal including an audio pop.

In this example, at time 140, an indication of a requested switch state is received, and the switch 105 changes from providing the second audio signal as the output signal to providing the first audio signal as the output signal. Because there is a difference in potential between the first and second audio signals at time 140, an audio pop or other distortion results at the output signal.

Figure 8:
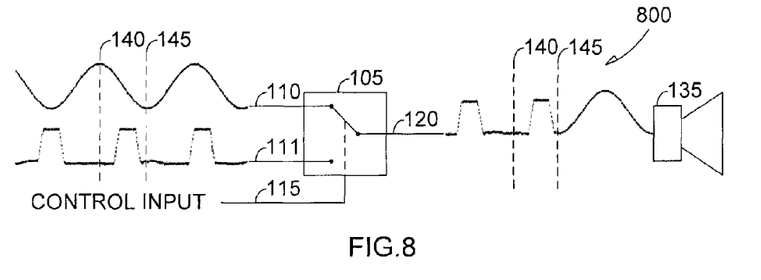
FIG. 8 illustrates generally an example of a system that can include an audio switch configured to receive first and second audio signals and to produce an output signal without audio pop.

FIG. 8 illustrates generally an example of a system 800 including an audio switch 105 having a first input 110 configured to receive a first audio signal, a second input 111 configured to receive a second audio signal, a control input 115 configured to receive a control signal, and an output 120 configured to provide an output signal to a speaker 135, the output signal not including an audio pop.

In this example, at time 140, an indication of a requested switch state is received, but the switch 105 does not change from providing the second audio signal as the output signal to providing the first audio signal as the output until time 145. In this example, the control signal delays the switch state change until the first signal reaches or approaches the second signal. Because there is no little or no difference in potential between the first and second audio signals at time 145, no audio pop or other distortion results at the output signal.

Figure 9:
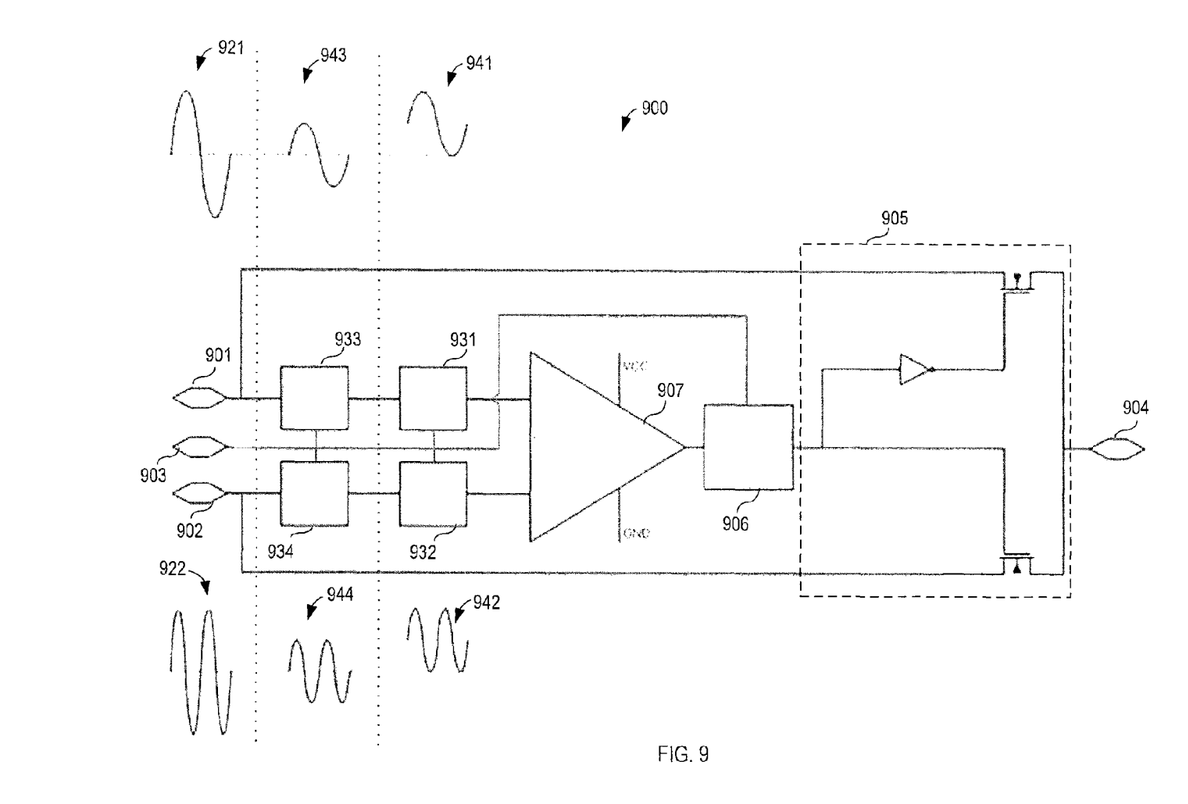
FIG. 9 illustrates generally an example of a multi-input switch circuit such as included as a portion of a system such as illustrated in FIG. 5.

FIG. 9 illustrates generally an example of a multi-input switch circuit such as included as a portion of a system such as illustrated in FIG. 5. In an example, the circuit 900 can use a single-ended power supply, such as operating using a single supply voltage (e.g., $V_{cc}$), as opposed to requiring a bipolar power supply providing both a positive voltage and a negative voltage, with respect to a common reference (e.g., GND). The present inventors have recognized, among other things, that the single-supply operating capability of circuit 900 can reduce circuit size (e.g., footprint or complexity) or save costs as compared to a circuit requiring a bipolar supply. Such costs can include design and manufacturing costs, or costs associated with systems using the circuit 900. The circuit 900 can include a first input 901, such as configured to receive a first signal 921 and a second input 902, such as configured to receive a second signal 922. The circuit 900 can include a control input 903, such as configured to receive a request that either the first input 901 or the second input 902 be switched to the output 904 of the circuit 900. The circuit 900 can include a switch 905, such as configured to receive the first 921 and second 922 signal and configured to couple the requested signal to the output 904 of the switch, such as in response to the control input 903. The circuit 900 can include a controller 906. The controller 906 can respond to one or more received requests, and, in response, coordinate a switching action of the switch 905 such that a disruption of the output signal is substantially avoided or reduced. Such disruptions can include, but are not limited to, audio clicks, audio pops and visual distortions.

In an example, the controller 906 can monitor the first and second signals and switch the switch 905 when the signals are at approximately the same level, such as discussed above with respect to the examples of FIGS. 4-8. In some examples, the controller 906 can switch the switch 905 when the first and second signals are at approximately the same level and in phase, or ramping in the same direction. In an example, such as shown in FIG. 9, the circuit 900 can include a comparator 907, such as configured to receive information about the first and second signals, such as to provide switch transition information to the controller 906. In an example, such switch transition information can include information about an amplitude relationship of the first and second signals, a phase relationship of the first and second signals or both, among other information. For example, if the switch transition information satisfies one or more criteria indicative of a disturbance-free (or a reduced disturbance) switching opportunity, the controller 906, in response to a signal from the comparator 907, can trigger the switch 905 to change states between coupling the first and second signals to the output 904 of the circuit.

The use of a single polarity voltage supply may limit the ability of the controller 906 to track the full swing of various input signals that can be applied to the circuit 900. In an example, the circuit 900 can include a single polarity voltage supply, such as a single positive voltage supply $V_{cc}$, along with one or more level shifting circuits such as a first shift circuit 931 or a second shift circuit 932. The respective shift circuits 931-932 can be used to translate or otherwise provide a signal-conditioned representation the first and second signals 921, 922, such that such that the peak-to-peak range of the translated or conditioned versions of the signals are within the dynamic range of the comparator 907 or other circuitry of the circuit 900. For example, such translation or condition can be used to provide versions of the first and second signals that are constrained to voltage swings within range just above a GND voltage and just below the positive rail voltage $V_{cc}$ of the power supply. Such translated or conditioned versions of the first 921 or second 922 signals can be used by the comparator 907, as discussed above, such as to provide switch transition information satisfying one or more criteria indicative of a disturbance-free (or a reduced disturbance) switching opportunity.

In an example, the circuit 900 can include one or more respective attenuators or limiters to attenuate or limit the respective first or second signals 921, 922. For example, the circuit 900 of FIG. 9 can include a first attenuator 933 or a second attenuator 934. One or more of the respective attenuators 933, 934 can be used to limit the peak-to-peak voltage swing of the first or second signals 921 to a range corresponding to the voltage range (e.g., a specified voltage) of the single-ended supply. The present inventors have also recognized that such attenuation or limitation can allow a single-ended supply having a lower operating voltage to be used, as compared to a circuit 900 lacking such front-end limiting or attenuation circuitry. In the example of FIG. 9, attenuated representations 943, 944 of the respective first and second signals 921, 922 can be received by the respective shift circuits 931, 932 and can be processed into attenuated and shifted versions 941, 942 of the first and second signals 921, 922. The attenuated and shifted versions 941. 942 of the first and second input signals 921, 922 can be received by the comparator 907, which, in response, can provide switch transition information used to switch the output 904 of the circuit 900 such as to avoid substantial disruption at the output 904. In an example, a multi-input switch circuit 900 can be implemented as a single integrated circuit device, or as a portion of an integrated circuit device.

Figure 10:
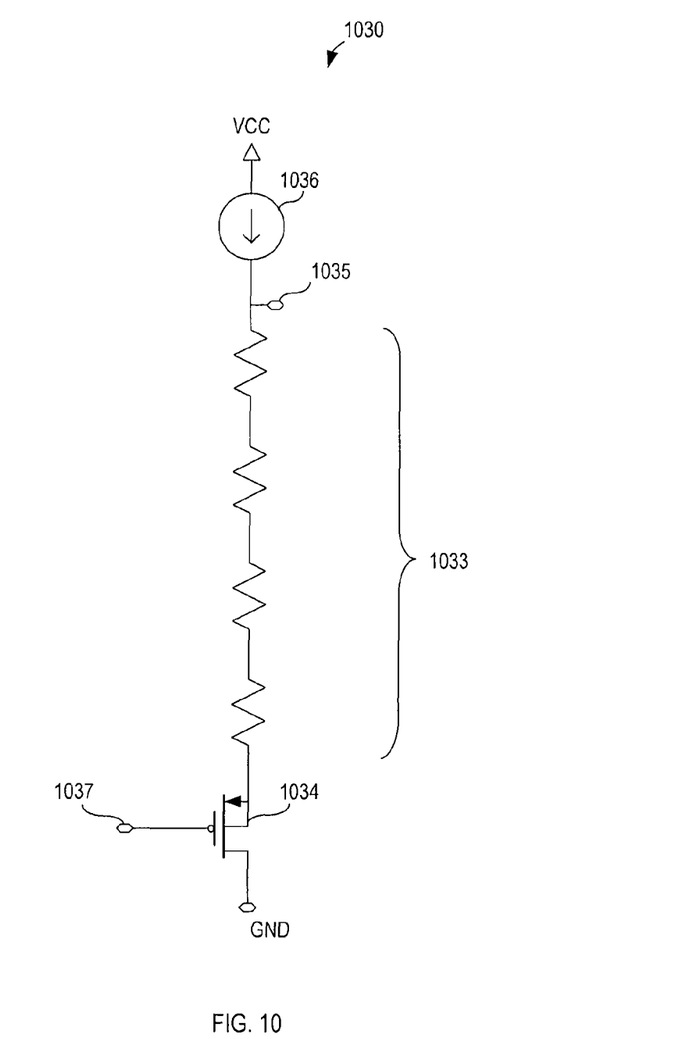
FIG. 10 illustrates generally an example of an offset circuit.

FIG. 10 illustrates generally an example of an offset circuit. The offset circuit 1030 can include one or more resistors, such as a resistor 1033, such as coupled to one or more transistors, such as a transistor 1034. In an example, the transistor 1034 can be coupled between a reference (e.g., GND), and one side of the resistor network. The circuit 1030 can include a current source 1036 coupled between the series of resistors 1033 and the supply voltage $V_{cc}$, such as including an output node 1035 between the resistor network and the current source 1036. A control input 1037 of the transistor 1034 can receive an incoming signal. An offset (e.g., a level-translated) version of the received signal can be provided at the output 1035 of the circuit 1030. In various examples, the amount of offset can be controlled by specifying one or more resistor values, by specifying a setpoint of the current source, or a combination thereof. In an example, the current source 1036 can be controlled by an enable input to switch the current source "on" only when needed (e.g., to reduce noise or to save on power consumption). For example, the current source can be turned "on" when a request to change the state of the switch is received (such as discussed above in the example of FIG. 5, and can be turned "off" after the state of the switch is changed in conformance with the request, or after an opportunity for changing the switch state is identified. In such examples, the offset circuit can include or can operate in response to a controller, such as to enable and disable the current source 1036. In an example, the offset circuit 1030 can receive an enable signal from control input 903 of FIG. 9.

Figure 11:
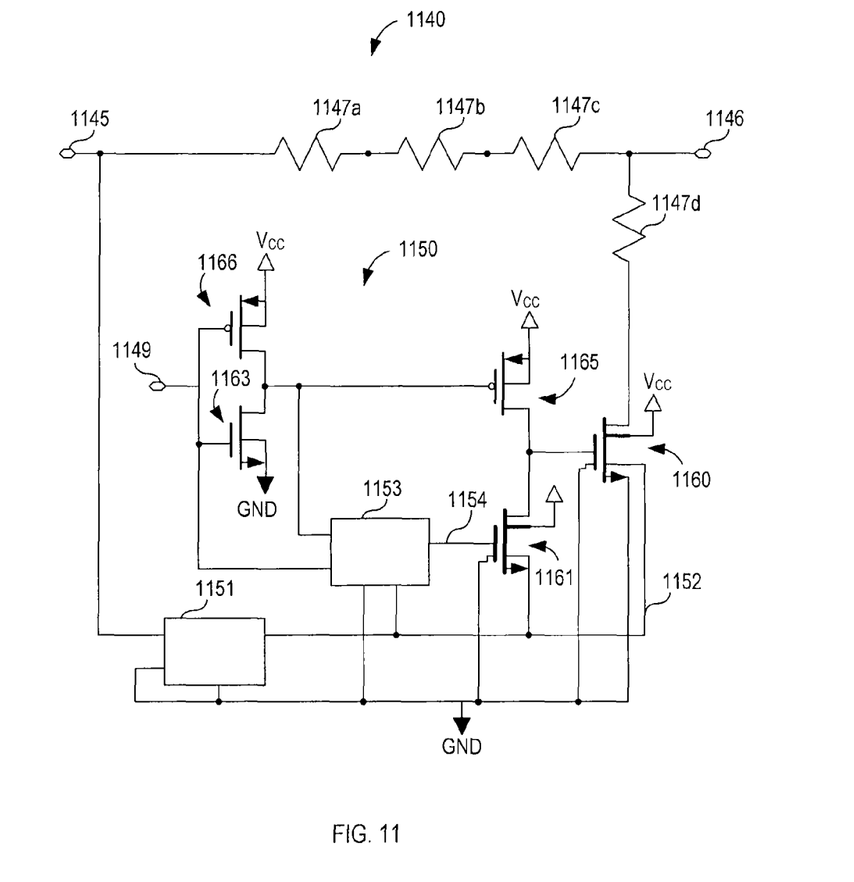
FIG. 11 illustrates generally an example of an attenuator circuit.

FIG. 11 illustrates generally an example of an attenuator circuit. The attenuator circuit 1140 can include an input 1145, such as configured to receive an input signal to be switched, and an output 1146, such as to provide an attenuated version of the received input signal. The attenuator circuit 1140 can include a power supply terminal, $V_{cc}$, configured to be coupled to a single polarity supply voltage, and a ground node GND. The attenuator circuit 1140 can include a resistor network 1147a-d coupled to the signal input 1145 and the output 1146 for providing the attenuated signal. In an example, an attenuator circuit 1140 can include resistors 1147a-d of substantially equal resistance such that the attenuated version of the signal includes a peak-to-peak voltage swing that is approximately 25% of the un-attenuated peak-to-peak voltage swing. In an example, one or more other resistor values can be used, such as to provide one or more other attenuation factors.

The resistor network 1147a-d can be coupled to a reference voltage, such as via an attenuator switch 1160. The attenuator switch 1160 can assist in conserving energy, such as by enabling the attenuation circuit 1140 when attenuation of an incoming signals is needed, such as when a request to change the state of the switch circuit 900 (FIG. 9) is received, and by disabling the circuit 900 during other specified times. The attenuator switch 1160 can enable attenuation of the received signal, such as in response to a request to change the state of the switch circuit. The attenuation switch 1160 can disable the attenuation circuit 1140 when the state of the switch circuit 900 has changed in conformance with the request, or after an opportunity for changing the state of the switch 905 has been identified. In such examples, the attenuator circuit 1140 can include or can be coupled to a controller, and, in response to a signal from the controller, the attenuator can be enabled or disabled. In some examples, the attenuator circuit can include an enable circuit 1150 and can receive an enable signal from the control input 903 of FIG. 9.

In an example, the attenuator circuit 1140 can be disabled when an enable input 1149 is at a low logic level. When the enable input 1149 is at a high logic level, a NMOS transistor 1163 can turn "on" pulling the control gate of transistor 1165 low. Transistor 1165 can turn "on" with a low logic level at the control gate and can pull the control gate of the isolated NMOS transistor 1160 high. A high logic level on the control gate of transistor 1160 can turn transistor 1160 "on", thus, coupling the resistor network 1147a-d to a reference and enabling signal attenuation using the attenuation circuit 1140.

In the illustrated example 1140, the enable circuit 1150 can include reference translator 1151 to allow the attenuated version of the received signal to swing in opposite polarity of the voltage supply $V_{cc}$ with respect to ground. For example, if the switch circuit 900 uses a positive polarity supply voltage, the reference translator 1151 can receive the un-attenuated signal and the voltage supply reference GND, or ground. The reference translator 1151 can provide a pseudo ground rail 1152 that is maintained at substantially the more negative of either the voltage supply reference GND or the un-attenuated signal value, thus, allowing the output of attenuator 1146 to swing below the voltage supply reference GND using the isolated NMOS transistor 1148.

The illustrated enable circuit 1150 of the attenuator 1140 of FIG. 11 can also include a down translator 1153 and second isolated NMOS transistor 1161 to keep the first isolated NMOS transistor 1160 "off" when the enable input 1149 is at a logic low value. The down translator 1153 can receive complementary versions of the enable signal using transistors 1163 and 1166. The down translator 1153 can also receive the voltage supply reference GND and the pseudo ground rail 1152. When the enable signal is low, the down translator 1153 can provide a corresponding high logic level output 1154 to the second isolated NMOS transistor 1161, enabling the second isolated NMOS transistor 1161 such that the gate of the first NMOS transistor 1160 can be pulled low. As the pseudo rail 1152 is pulled low by the reference translator 1151 in response to the received signal, the second isolated NMOS transistor 1161 can maintain a low logic level on the gate of the first isolated NMOS transistor 1160 to assure that the first NMOS transistor 1160 remains "off".

Figure 12A:
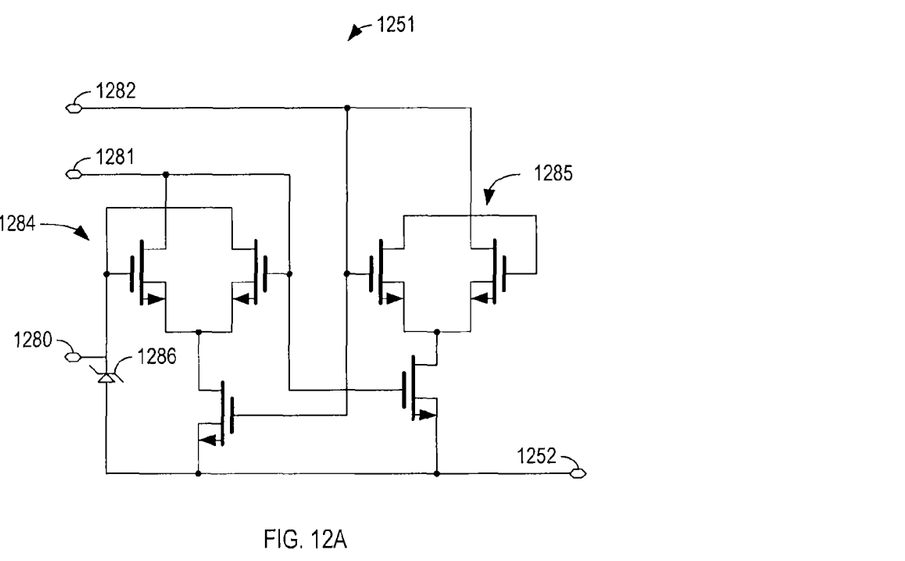
FIG. 12A illustrates generally an example of a reference translator.

FIG. 12A illustrates generally an example of a reference translator 1251 including a power supply reference input 1280, a first reference input 1281, a second reference input 1282, and a pseudo reference output 1252. The reference translator 1251 can maintain the pseudo reference output 1252 at the lower potential of either the first reference input 1281 or the second reference input 1282. In the illustrated example, the more positive reference input can turn "on" the corresponding transistor network 1284, 1285 to couple the pseudo output 1252 to the more negative reference input of the first reference input 1281, the second reference input 1282 and the power supply reference input 1280. In an example, a diode 1286 can assure that the pseudo reference output 1252 is no higher than a junction potential above the power supply reference input 1280. It is understood that other reference translators are possible for use with the circuit of FIG. 11 without departing from the scope of the present subject matter. In the example of FIG. 11, the first reference input 1281 can be coupled to the attenuator input 1145, and the second reference input 1282 and the power supply reference input 1280 can be coupled to the supply voltage reference GND.

Figure 12B:
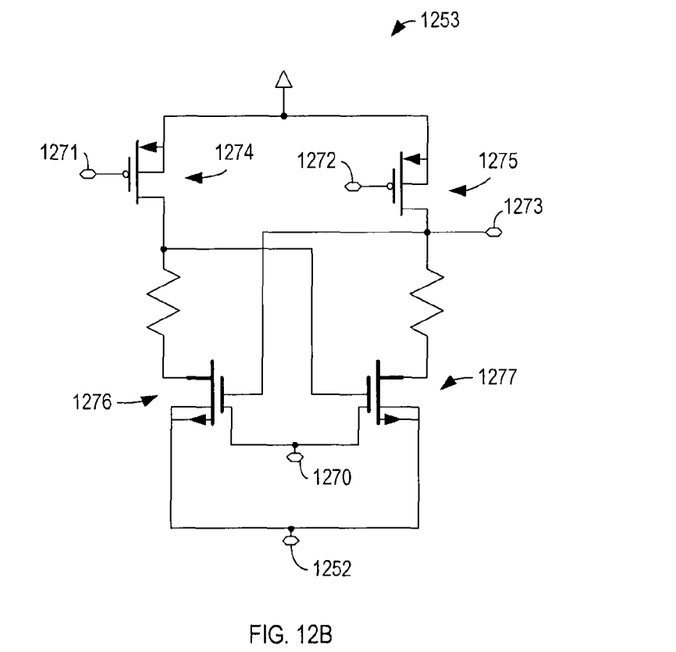
FIG. 12B illustrate generally an example of a down translator.

FIG. 12B illustrates generally an example of a down translator 1253 including a first input 1271 and second input 1272, an output 1273, a first input transistor 1274, a second input transistor 1275, a first isolated transistor 1276 cross coupled with a second isolated transistor 1277, a first reference input 1270 and a second reference input 1252. The down translator 1253 can provide a proper logic signal between devices having different references. In an example, a proper logic signal can be provided at the output 1273 when a complementary logic signal received on the first and second inputs 1271, 1272 is referenced to a first reference 1270, and a device receiving the logic signal is referenced to a second reference received 1252. In an example, the first reference input 1270 can be coupled to a circuit power supply, such as the power supply for the circuit of FIG. 11. The second reference input 1252 can be coupled to the pseudo ground rail 1152 of the circuit of FIG. 11. If the complementary signal received on the first and second inputs 1271, 1272 holds the first input high and the second input low, the second input transistor 1275 can turn "on", pulling the output 1273 to a high logic level. If the complementary signal received at the first and second inputs 1271, 1272 holds the first input low and the second input high, the first input transistor can turn "on", pulling the control input of the second isolated transistor 1277 "high". The second isolated transistor 1277 can pull the output 1273 low with reference to second reference input 1252, e.g. the pseudo ground rail 1152, thus maintaining a low logic level on the output 1272 even when the pseudo reference rail at the second reference input 1272 becomes more negative than the power supply reference at the first reference input 1271. It is understood that other down translators are possible for use with the circuit of FIG. 11 without departing from the scope of the present subject matter.

OTHER EXAMPLES

The present inventor has recognized, among other things, that the systems or methods described above can be used in a variety of switching applications (e.g., outside of audio or video switching) where an input signal and an output signal, or multiple input signals, can have different potentials. Further, one or more of the systems or methods described herein can be referred to as mixing technology.

In an example, mixing technology can be used to prevent the in-rush of current when switching between different potentials (e.g., switching between an input at a first potential and an output at a second different potential), potentially avoiding a short circuit condition or a shock. In certain examples, if at least one of the input or the output is variable, the switch can wait, after receiving a request to switch, until the potential at the input is at or near the potential at the output. In other examples, the switch can wait until the potential at the input is within a threshold amount from the potential at the output before switching. In an example, the threshold can be set by a user, or can vary with time. Initially, the threshold can be set at a first amount, and then, as time passes without the potential at the input being within the threshold amount from the potential at the output, the threshold can increase. In other examples, if the threshold is not reached within a period of time, an alert can be provided (e.g., similar to blowing a fuse, etc.), or a waiting period can expire and the switching can commence regardless of the difference.

In an example, the threshold can be programmable, and a user can set the threshold amount, or an actual voltage at which the switch will switch based on at least one of the input, the output, or the difference between the two.

In other examples, the difference in potential between the input and the output, or between multiple outputs, can be used determine a signal type and to switch to a signal having higher priority (e.g., giving priority to a first signal type, such as an audio signal, over a second signal type, such as USB data).

In an example, the mixing technology can be used for power-up stabilization, such as between power sources having different potentials (e.g., between a 5V source and a 3V source). In an example, when a power source is turned on, the output of the power source can gradually increase (or sometimes fluctuate) until it reaches a steady-state. In an example, when switching from a first power source to a second power source having a higher output, the switching can be delayed until the potential of the second power source is at or near the potential of the first power source. In contrast, when switching from a first power source to a second power source having a lower potential, the switching can be delayed until the difference between the potentials of the first and second power sources is minimized or otherwise meets a threshold amount.

In an example, a switch (e.g., having one or more inputs, one or more outputs, one or more channels, etc.) can self-isolate using a difference between an input and an output, or using a difference between or comparison of at least one of an input or an output and a predetermined electrical condition. In certain examples, the predetermined electrical condition can include a voltage or current threshold, a phase, a slew rate, or one or more other electrical conditions. The switching can be delayed until one or more of the conditions are met, or if the condition is met, the switch can be opened or closed, depending on the desired result. In certain examples, a closed switch can be opened, an opened switch can be closed, or a different input can be selected if at least one of the input or the output exceeds a voltage or current threshold, a slew rate, or one or more other electrical conditions.

Additional Notes

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
   a switch including:
      a first input;
      a second input;
      a control input configured to receive a control signal and in response to the control signal, to couple one of the first or the second inputs to an output; and
      the output configured to provide an output signal; and
   a control circuit configured to receive a first signal, a second signal, and an indication of a requested switch state, to provide the control signal to the switch, and to delay a switch state change until the indication of the requested switch state is different than a current switch state;
wherein the control circuit is configured to compare the first signal to the second signal and to change the state of the switch when the difference between the first signal and the second signal satisfies a threshold;
wherein the first signal includes a representation of a first input signal received at the first input, a representation of a second input signal received at the second input, or a representation of the output signal; and
wherein the second signal is different from the first signal and includes the representation of the first input signal received at the first input, the representation of the second input signal received at the second input, or the representation of the output signal.

2. The apparatus of claim 1, wherein the first signal includes the representation of the first input signal and the second signal includes the representation of the output signal.

3. The apparatus of claim 1, wherein the first signal includes the representation of the second input signal and the second signal includes the representation of the output signal.

4. The apparatus of claim 1, wherein the representation of the first signal includes an offset representation of a first input signal received at the first input and the representation of the second signal includes an offset representation of a second input signal received at the second input.

5. The apparatus of claim 1, wherein the first signal includes the representation of the first input signal received at the first input and the second signal includes the representation of the second input signal received at the second input.

6. The apparatus of claim 5, wherein the control circuit includes a first shift circuit configured to provide an offset version of the first signal within a specified voltage range above a specified reference voltage when the requested switch state is different than the current switch state, and wherein the representation of the first signal includes the offset version of the first signal; and
wherein the control circuit includes a second shift circuit configured to provide an offset version of the second signal within a specified voltage range above a specified reference voltage when the requested switch state is different than the current switch state, and wherein the representation of the second signal includes the offset version of the second input signal.

7. The apparatus of claim 6, wherein each of the first and second shift circuits are configured to be enabled when the indication of the requested switch state is different than a current switch state, and are configured to be disabled when the indication of the requested switch state is the same as the current switch state to conserve power consumption.

8. The apparatus of claim 6, wherein at least one of the first or second shift circuits includes:
a current source;
a resistive network coupled to the current source; and
a transistor, wherein the transistor includes:
a source terminal coupled to the resistive network in series with the current source;
a drain terminal coupled to ground; and
a gate terminal configured to receive a signal; and
wherein an offset version of the signal is provided at a junction of the resistive network and the current source.

9. The apparatus of claim 6, wherein the control circuit includes
a first attenuator configured to attenuate the magnitude of the first signal and to provide the attenuated first signal to the first shift circuit; and
a second attenuator to attenuate the magnitude of the second signal and to provide the attenuated first signal to the first shift circuit.

10. The apparatus of claim 9, wherein each of the first attenuator and the second attenuator includes a voltage divider to attenuate the first signal and the second signal.

11. The apparatus of claim 10, wherein each of the first attenuator and the second attenuator includes an enable circuit configured to receive an enable signal, to provide an attenuated version of a received signal when the enable signal is in a first state, and to reduce power consumption of the attenuator when the enable signal is in a second state.

12. The apparatus of claim 11, wherein each of the first attenuator and the second attenuator includes respective isolated transistor coupled to the voltage divider, the isolated transistor configured to allow the attenuated signal to oscillate about ground using a single voltage source when the enable signal is in the first state, wherein a reference voltage of the isolated transistor is responsive to a negative swing of the received signal.

13. The apparatus of claim 12 wherein the enable circuit is configured to disable the isolated NMOS transistor when the enable signal is in the second state.

14. The apparatus of claim 5, wherein the switch includes an audio switch, the first signal includes a first audio signal, the second signal includes a second audio signal, and the output of the audio switch is configured to be coupled to a speaker.

15. The apparatus of claim 5, wherein the switch includes a video switch, the first signal includes a first video signal, the second signal includes a second video signal, and the output of the video switch is configured to be coupled to a display.

16. A method for operating a switch circuit, the method comprising:
receiving a first input signal at a first input of a switch of the switch circuit;
receiving a second input signal at a second input of the switch
receiving a control signal at a control input of the switch;
providing the first input signal at an output of the switch when the control signal indicates a first state to provide an output signal;
generating switch transition information using a first signal and a second signal, wherein the generating the switch transition information includes:
comparing the first signal to the second signal to determine a difference between the first signal and the second signal;
providing the second input signal at the output of the switch when the control signal indicates a second state and when the difference satisfies a threshold;
wherein the first signal includes a representation of a first input signal received at the first input, a representation of a second input signal received at the second input, or a representation of the output signal; and
wherein the second signal is different from the first signal and includes the representation of the first input signal received at the first input, the representation of the second input signal received at the second input, or the representation of the output signal.

17. The method of claim 16, wherein the comparing the first signal to the second signal includes comparing the representation of the second input signal to the representation of the output signal.

18. The method of claim 16, wherein the comparing the first signal to the second signal includes comparing the representation of the first input signal to the representation of the second input signal.

19. The method of claim 16, including:
- shifting the first input signal above ground to provide the representation of the first input signal; and
- shifting the second input signal above ground to provide the representation of the second input signal.

20. The method of claim 19, wherein the shifting the first input signal includes attenuating the first input signal to limit a range of the representation of the first input signal from about ground to about the voltage value of a single supply voltage, the single supply voltage configured to power the switch circuit; and
- wherein the shifting the second input signal includes attenuating the second input signal to limit a range of the representation of the second signal from about ground to about the voltage value of the single supply voltage.

\* \* \* \* \*